(12) United States Patent
Nash (10) Patent No.: US 7,106,604 B2
(45) Date of Patent: Sep. 12, 2006

(54) SYSTEM AND METHOD FOR REDUCING TRANSFER FUNCTION RIPPLE IN A LOGARITHMIC RMS-TO-DC CONVERTER

(75) Inventor: Eamon Nash, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 214 days.

(21) Appl. No.: 10/774,905

(22) Filed: Feb. 9, 2004

(65) Prior Publication Data

US 2004/0223349 A1 Nov. 11, 2004

Related U.S. Application Data

(60) Provisional application No. 60/447,571, filed on Feb. 14, 2003.

(51) Int. Cl.
*H02M 1/12* (2006.01)
*G05F 1/40* (2006.01)

(52) U.S. Cl. ...................................................... 363/39

(58) Field of Classification Search ............... 323/268, 323/270, 273, 275, 280, 281; 363/39, 45, 363/46; 330/252, 259, 270, 271, 273, 278, 330/282, 285, 291, 296, 297, 129, 133–141
See application file for complete search history.

(56) References Cited

U.S. PATENT DOCUMENTS

| 3,918,003 | A | | 11/1975 | Seidel |
| 5,126,686 | A | * | 6/1992 | Tam ............................ 330/134 |
| 5,319,804 | A | * | 6/1994 | Matsumoto et al. ......... 455/126 |
| 5,724,003 | A | | 3/1998 | Jensen et al. |
| 6,348,781 | B1 | * | 2/2002 | Midya et al. ................ 323/224 |
| 6,750,719 | B1 | * | 6/2004 | Toyota et al. ................ 330/285 |

* cited by examiner

*Primary Examiner*—Matthew V. Nguyen
(74) *Attorney, Agent, or Firm*—Gauthier & Connors LLP (57) ABSTRACT

An RMS-to-DC converter system is disclosed. The system includes a variable gain amplifier having transfer function ripple that receives an input signal and provides an amplifier output signal, a detector that receives the amplifier output signal and provides a detector output signal, an error amplifier that receives the detector output signal and provides an error amplifier output signal having an AC component, and a feedback circuit coupled to the error amplifier output signal and to the variable gain amplifier for providing a feedback signal to the variable gain amplifier that includes an AC component for reducing transfer function ripple of the RMS-to-DC converter system.

19 Claims, 8 Drawing Sheets

SYSTEM AND METHOD FOR REDUCING TRANSFER FUNCTION RIPPLE IN A LOGARITHMIC RMS-TO-DC CONVERTER

PRIORITY

This application claims priority to U.S. Provisional Patent Application Ser. No. 60/447,571 filed Feb. 14, 2003.

BACKGROUND

The invention generally relates to power control systems for signal transmission systems, and relates in particular to power monitoring systems for radio frequency (RF) transmitters.

Conventional transmitters for wireless telephone cellular networks generally require strict control of transmitted RF power. In wireless cellular networks, strict power control permits the size of cells to be precisely set to enhance coverage. Precise power control also avoids the need for excessive thermal dimensioning of the RF power amplifier (PA), which is required when there is uncertainty about the actual transmitted power. For example if a 50 W (47 dBm) power amplifier has a transmit power variability of even ±1 dB, the PA must be dimensioned so that it may safely (i.e., without overheating) transmit 63 Watts (48 dBm). Power measurement and control is also used in the receive section, usually at intermediate frequencies (IFs). In certain applications it is desirable to measure and control the gain of the received signal so that IF amplifiers and analog-to-digital converters (ADCs) are not overdriven. While precision in the measurement of the received signal (commonly referred to as received signal strength indicator or RSSI) is useful for maximizing the signal-to-noise ratio, it is less important than on the transmit side, the goal being to merely keep the received signal under a certain limit.

Root-mean-square (RMS) RF power detectors are capable of measuring RF power independent of signal peak-to-average ratio or crest factor. This is critical when the peak-to-average ratio of a measured signal is changing, which is common in wireless cellular networks due to the ever-changing number of calls being carried by a cellular basestation. The changing peak-to-average ratio results both from the transmission of multiple carriers at varying power levels and from the variations in code-domain power in a single Code Division Multiple Access carrier.

RMS power detection, therefore, is required to measure and control transmitted power in multi-carrier wireless infrastructure. Traditional power detectors, using diode detection or log amps do not accurately measure power when the peak-to-average ratio of the transmitted signal is not fixed.

There is a need, therefore, for a system and method for efficiently and accurately measuring the power in a multi-carrier wireless infrastructure.

SUMMARY

The invention provides an RMS-to-DC converter system. The system includes a variable gain amplifier having transfer function ripple that receives an input signal and provides an amplifier output signal, a detector that receives the amplifier output signal and provides a detector output signal, an error amplifier that receives the detector output signal and provides an error amplifier output signal having an AC component, and a feedback circuit coupled to the error amplifier output signal and to the variable gain amplifier for providing a feedback signal to the variable gain amplifier that includes an AC component for reducing transfer function ripple of the RMS-to-DC converter system in accordance with certain embodiments.

In other embodiments, the system may also include a reference input for receiving a reference signal, and the reference signal may itself have an AC component, such as a sine wave or white noise.

BRIEF DESCRIPTION OF THE DRAWINGS

The following description may be further understood with reference to the accompanying drawings in which.

The drawings are shown for illustrative purposes only.

DETAILED DESCRIPTION OF THE ILLUSTRATED EMBODIMENTS

The invention provides systems that may be used to improve the linearity of an RMS detector's transfer function (e.g., to less than ±0.3 dB over a dynamic range of over 50 dB).

Figure 1:
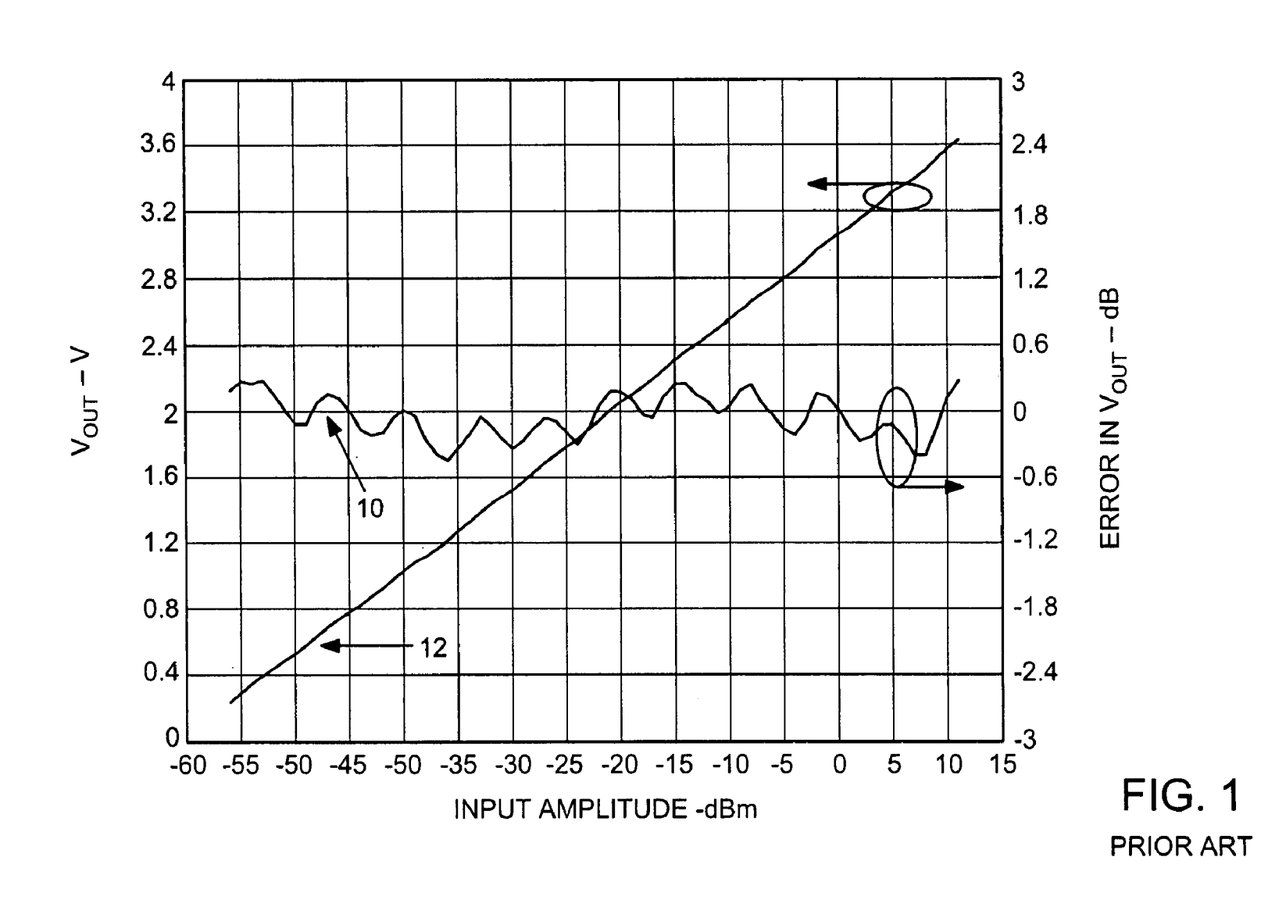
FIG. 1 shows a diagrammatic illustrative graphical view of transfer function performance of a logarithmic RMS-to-DC converter in accordance with the prior art.

An RMS-to-DC converter, such as the AD8362 sold by Analog Devices of Norwood Mass., may measure RMS voltages over a range of over 60 dB over a frequency range spanning from very low frequencies up to approximately 2.7 GHz. FIG. 1 shows the transfer function of the AD8362 at 2.2 GHz in terms of volts out vs. input signal strength in dBm relative to a 50 Ω resistance.

As shown in FIG. 1, the transfer function of a logarithmic RMS-to-DC converter shows a linear-in-dB relationship between the output voltage (scaled in volts on the left side axis) and the dB-scaled input signal as shown at 12. FIG. 1 also illustrates the deviation of this transfer function from a best-fit line (scaled on the right side axis) as shown at 10. This line has a slope and intercept that may be calculated using a linear regression of the measured data. Once the slope and intercept of the line are calculated, an error plot, scaled in dB may be plotted. This plot shows a repetitious ripple. The ripple may be as large as 0.75 db peak-to-peak. This peak-to-peak ripple results in an equally large measurement uncertainty.

Figure 2:
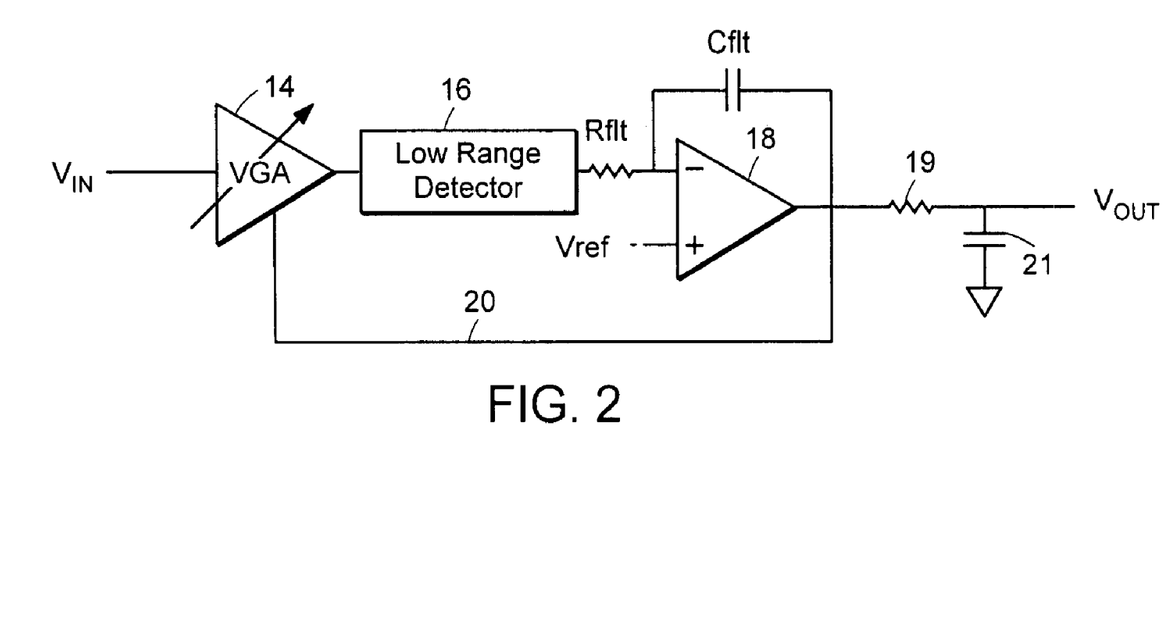
FIG. 2 shows a diagrammatic illustrative schematic view of an RMS-to-DC converter system in accordance with an embodiment of the invention.

A system in accordance with an embodiment of the invention may include a variable gain amplifier 14, a low range detector 16 (such as an RMS detector), and an error amplifier 18. The system also includes a feedback path 20 from the output of the error amplifier 18 to a gain control input of the variable gain amplifier 14. The error amplifier 18 receives a reference voltage ($V_{ref}$) at the positive input port and the output of the detector via a resistor ($R_{flt}$) at the negative input port. The error amplifier also includes a feedback path from its output to the positive input via a capacitor ($C_{flt}$). The output path of the system includes an RC circuit with a series resistor 19 and a capacitor to ground 21 as shown. During operation, the feedback path 20 to the amplifier 14 includes some AC component such as noise. The presence of this disturbance has been found to improve the ripple of the transfer function. In various embodiments, a noise signal may be introduced at the reference input to the error amplifier 18, or may be present on the signal that is output by the detector. In further embodiments, the system may operate in a current mode in which a current signal is output from the detector and combined with a current reference signal to provide an output current signal.

Figure 3:
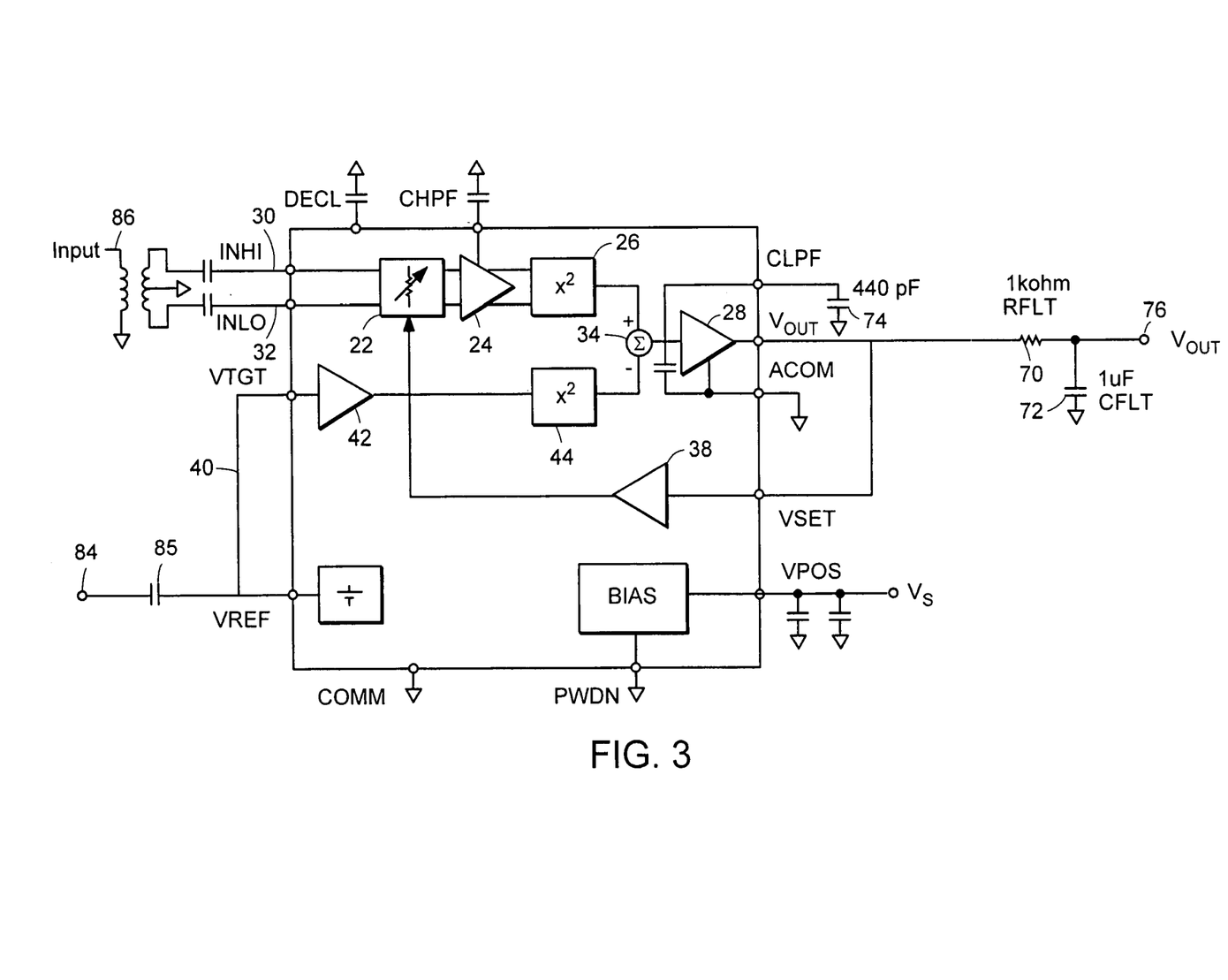
FIG. 3 shows a diagrammatic illustrative schematic view of an RMS-to-DC converter system in accordance with an embodiment of the invention.

A specific implementation of a circuit in accordance with an embodiment of the invention may be a logarithmic RMS-to-DC converter circuit as shown in FIG. 3. The circuit includes a linear-in-dB variable gain amplifier (VGA) including a voltage-controlled-attenuator 22 and a fixed gain amplifier 24, a low dynamic range RMS-to-DC converter 26 and an error amplifier 28. The differential input signal 30, 32 to the RMS-to-DC converter is applied to the input to the VGA. The output of the VGA is applied to the low-range RMS-to-DC converter 26. The output of the detector is compared at 34 to a set-point voltage 36 that generates an error signal that feeds back to the gain control input of the VGA via an amplifier 38. The output of the detector is proportional to the RMS voltage of the VGA output signal (and is not proportional to the log of the input signal).

A fixed reference voltage 40, also referred to as the target voltage, is applied to an amplifier 42 and low dynamic range RMS-to-DC converter 44 that is identical to the converter 26. The outputs of the two detectors are applied to the error amplifier/integrator 34, which produces the error signal. The gain control transfer function of the VGA is negative, so an increasing voltage decreases the gain.

When a small input signal is applied to the circuit at 30, 32, the initially small voltage from the signal-path detector will be small, producing a decreasing error signal that drives the VGA. This error signal increases the VGA gain, until the output of the signal chain detector is equal to the output of the reference detector. Similarly, a large input signal will produce an increasing error signal that decreases the gain of the VGA until the voltage from the signal-path detector is equal to the reference detector. In all cases, when the system reaches equilibrium, the input voltage to the detector settles to the same value. As a result, the low-range RMS-to-DC converter needs very little operating range for the circuit to work. The transfer function of the VGA is linear-in-dB, that is, the gain in dB is inversely proportional to the control voltage, scaled in Volts. In the present embodiment, the slope of the VGA's gain control is approximately 50 mV/dB. This results in a transfer function for the overall circuit (i.e., the relationship between the input to the VGA and the output of the error amplifier) that is logarithmic, so the output voltage is proportional to the log of the RMS input voltage.

Figure 4:
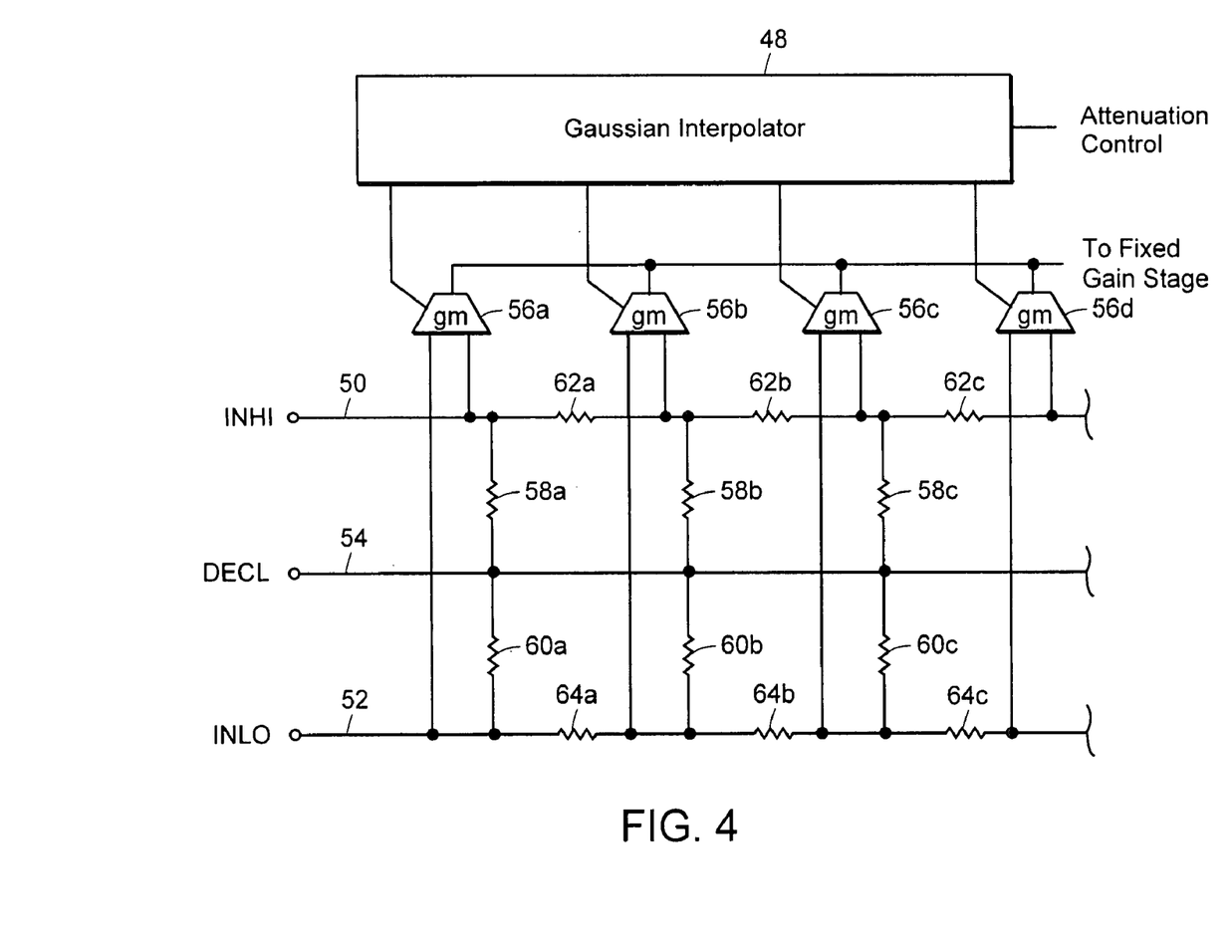
FIG. 4 shows a diagrammatic illustrative schematic view of an attenuator with a Gaussian interpolator for an RMS-to-DC converter for use in a system in accordance with an embodiment of the invention.

The source of the ripple shown in the conformance curve in FIG. 1 is a Gaussian interpolator that determines the nodes from which the signal is taken from the variable attenuator, to be then applied to the fixed gain amplifier that comprises the output stage of the variable gain amplifier. As shown in FIG. 4; the attenuator and Gaussian interpolator circuit for the RMS-to-DC converter of the present embodiment includes a plurality of sections that are coupled to the Gaussian interpolator 48, and the first section of which is coupled to a differential input port at 50, 52 (which are coupled to the input ports 30, 32 of FIG. 3) and a DECL port 54. Each section (sections a, b and c are shown) includes a transconductance stage 56, a pair of divider resistors 58, 60, and a pair of resistors 62, 64. The circuit provides the voltage controlled attenuation within the attenuator 22. While the presence of the Gaussian interpolator yields a continuous relationship between output voltage and control voltage, the relationship has a periodic ripple. Each section (a, b and C are shown) of the input ladder attenuator attenuates the input signal by 6.33 dB. The signal is tapped off of these sections via variable trans-conductance stages. The Gaussian interpolator determines which trans-conductance stages are active, based upon the control signal that is applied to the control port of the variable attenuator, thereby determining the amount of attenuation applied to the input signal.

Attenuation levels that fall between tap points require that adjacent trans-conductance stages be active simultaneously, in order to produce a weighted average of these tap points according to which the trans-conductance cell is further directed to conduct current. The manner in which the conductance of adjacent stages changes, in order to slide the tap point along the attenuator, is responsible for the ripple observed in the conformance curves.

The squaring cell in the low-range RMS-to-DC converter produces a component at DC along with a component at twice the input frequency. This follows from the trigonometry identity:

$$\cos^2(\omega t) = \tfrac{1}{2}(1+\cos(2\omega t))$$

If this signal is a single tone sine wave, the output of the squaring cell will be a DC component and a sine wave tone at twice the input frequency. The dominant pole of the error amplifier/integrator will filter out the double frequency component leaving just the DC component. If the input signal is a broad-band signal such as a CDMA or Wideband CDMA (WCDMA) signal, the component that appears at DC now spans the range from DC to half the original signal bandwidth. Therefore, once the double frequency has been filtered out, the output of the circuit that is fed back to the VGA still contains a significant ac component that appears as a noise-like signal superimposed on a DC level. The conventional practice is to increase the filtering in the error amplifier to such a degree that the noise on the signal at the output of the error amplifier is significantly reduced. This results in a noise-free output from the overall circuit.

As further shown in FIG. 3, the transfer function ripple may be removed in a circuit that takes advantage of the base-band noise as follows. The system of FIG. 3 may optionally include a series resistor 70 in the output path and a capacitor 72 to ground at the output side of the resistor 70. The size of the integrator's external filter capacitor 74 is significantly reduced but is still kept large enough to effect a valid RMS averaging. The external filter capacitor is preferably less than about 500 pF and in particular may be 440 pF in an embodiment. When a broadband signal is applied as an input to the circuit, the output of the error amplifier contains significant noise but is still centered on the correct RMS output level. The noise level at the output of the error amplifier is set to a level of at least 300 mVpp, 300 mV being the distance in dB between adjacent taps on the R-2R ladder of the VGA times the gain control slope of the VGA (i.e., 50 mV/dB times 6 dB). As long as this output noise level is at least 300 mVpp, its actual value is not critical.

Figure 5A:
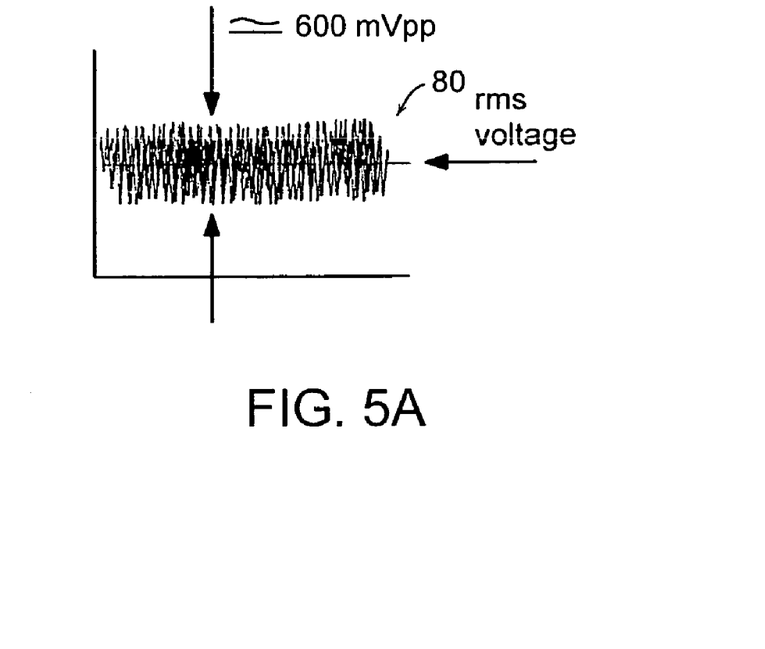
FIGS. 5A and 5B show diagrammatic illustrative graphical views of signals at two locations within the circuit shown in FIG. 3.
Figure 5B:
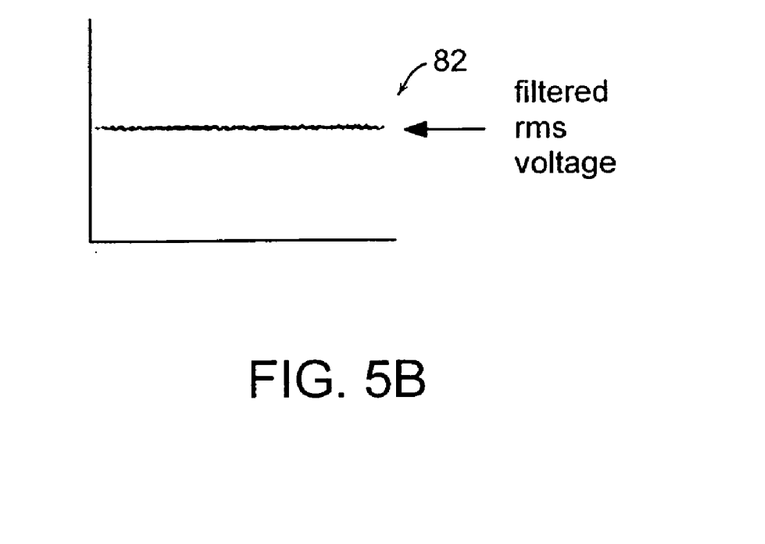

The lightly filtered signal that is output by the amplifier 28 (and which is shown at 80 in FIG. 5A) is fed back to the VGA control input. The noise that is contained in this signal causes the gain of the VGA to fluctuate around a central point. The gain control slope of the VGA is 50 mV/dB. As a result, the noise will cause the instantaneous gain of the VGA to change by approximately 6 dB. This tends to even out the ripple in the transfer function of the VGA, which is turn evens out the transfer function of the overall circuit. The wiper of the Gaussian interpolator, therefore, is moved back and forth across approximately one tap of the R-2R ladder. Because the gain-control voltage is constantly moving across at least one tap of the Gaussian interpolator, the relationship between the RMS signal strength of the VGA output and the VGA control voltage becomes independent of the VGA's gain control ac component. The signal being applied to the squaring cell is now lightly AM modulated. This does not, however, change the peak-to-average ratio of the signal. Because of the reduced filter capacitor, the RMS voltage appearing at the output of the error amplifier now contains significant peak-to-peak noise. While it is critical to feed this signal back to the VGA gain control input with the noise intact, the RMS voltage going to the external measurement node 76 may be filtered using a simple RC filter 70, 72 to yield a largely noise-free RMS voltage as shown at 82 in FIG. 5B.

Figure 6:
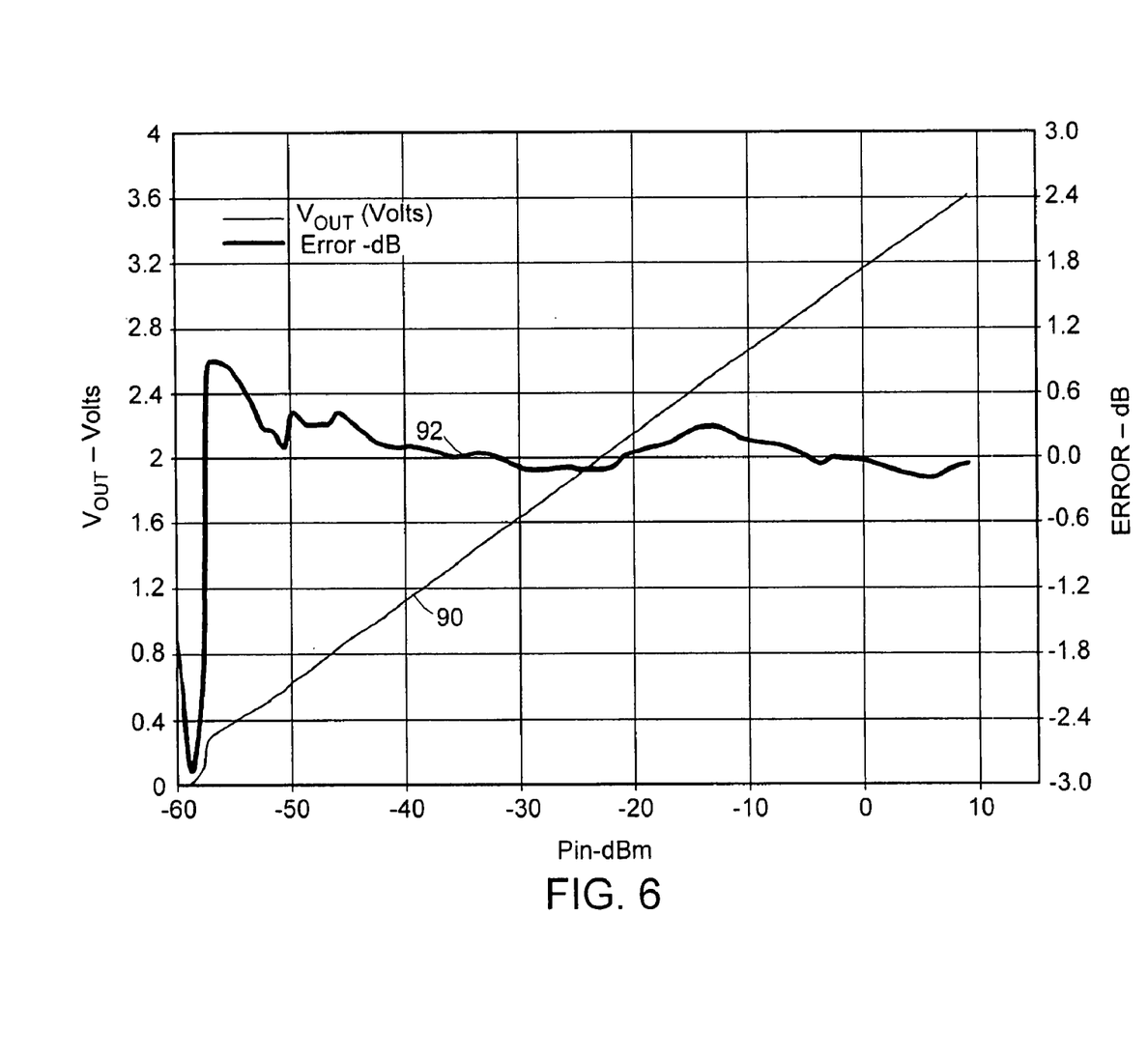
FIG. 6 shows a diagrammatic illustrative graphical view of a transfer function ripple of a system in accordance with an embodiment of the invention for a high peak-to-peak average ratio signal.

FIG. 6 shows the resulting reduction in transfer function ripple of the RMS-to-DC converter shown in FIG. 3 for a high peak-to-average ratio signal (single-carrier WCDMA, test Model 16, 2.2 GHz). The voltage is shown at 90 and is scaled on the left-side axis, and the error is shown at 92 and is scaled on the right-side axis. The peak-to-peak noise 600 mV fed back to the VGA gain control terminal may seem needlessly large as only enough noise is required to exercise the gain control voltage over 6 dB (1 tap on the R-2R ladder). As the call-loading in a spread-spectrum CDMA signal decreases however, the peak-to-average ratio of the signal also decreases. This will result in less noise appearing at the detector output. As a result, the peak-to-peak noise is set so that it spans at least 1 tap on the R-2R ladder.

If a sine-wave is applied to the above modified circuit, no reduction in transfer function ripple results because no base-band noise is produced at the output of the low-range RMS detector. When the sine wave is applied to the squaring cell, the output products are the double frequency and a dc voltage level. Because the sine wave is narrow-band, no noise-like voltages appear close to DC. Once the double frequency has been removed, there is no available ac component to exercise the VGA's gain control input over any range.

Figure 7A:
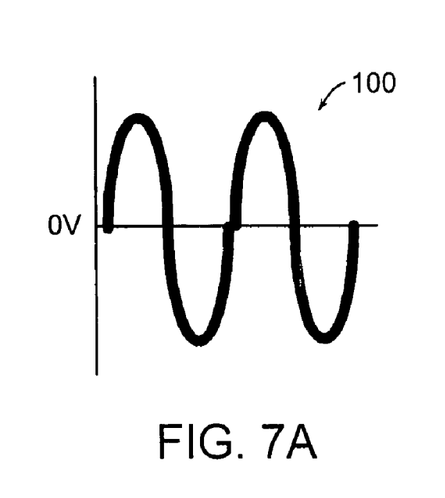
FIGS. 7A–7D show diagrammatic illustrative graphical views of signals at four locations within the circuit shown in FIG. 3.
Figure 7B:
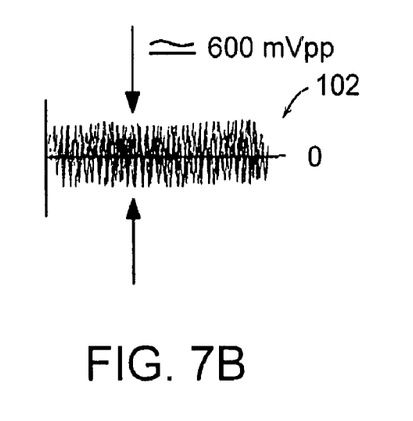
Figure 7C:
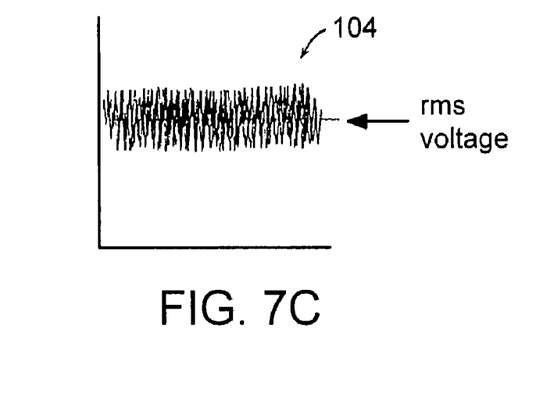
Figure 7D:
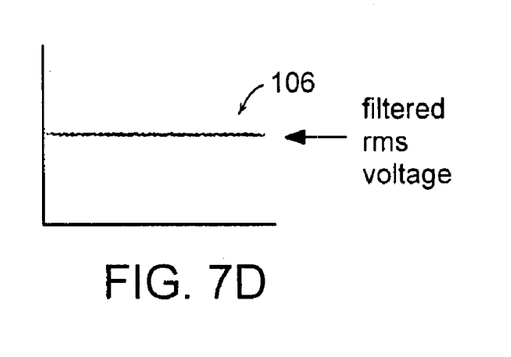

In further embodiments of the invention a circuit may be employed for certain applications, for example when the input signal is a single tone signal that does not produce substantial multi-frequency base-band noise. Again with reference to FIG. 3, an optional A/C signal may be employed in certain embodiments. The A/C signal is required to exercise the VGA and is provided at node 84 through a series capacitor 85. The A/C signal is input to the reference voltage 40 (also called the target voltage). This produces a disturbance at the output of the error amplifier that is fed back to the VGA gain control input. The signal that is coupled on to the VREF signal may be either noise or a coherent signal such as a sine-wave. If an input signal in the form of a sine-wave (as shown at 100 in FIG. 7A) is provided at the input 86 of FIG. 3, and the A/C signal (as shown at 102 in FIG. 7B) is provided at node 84, and the input signal to the amplifier 28 is lightly filtered (as shown at 104 in FIG. 7C), then the system output at node 76 will be ripple free (as shown at 106 in FIG. 7D).

Figure 8:
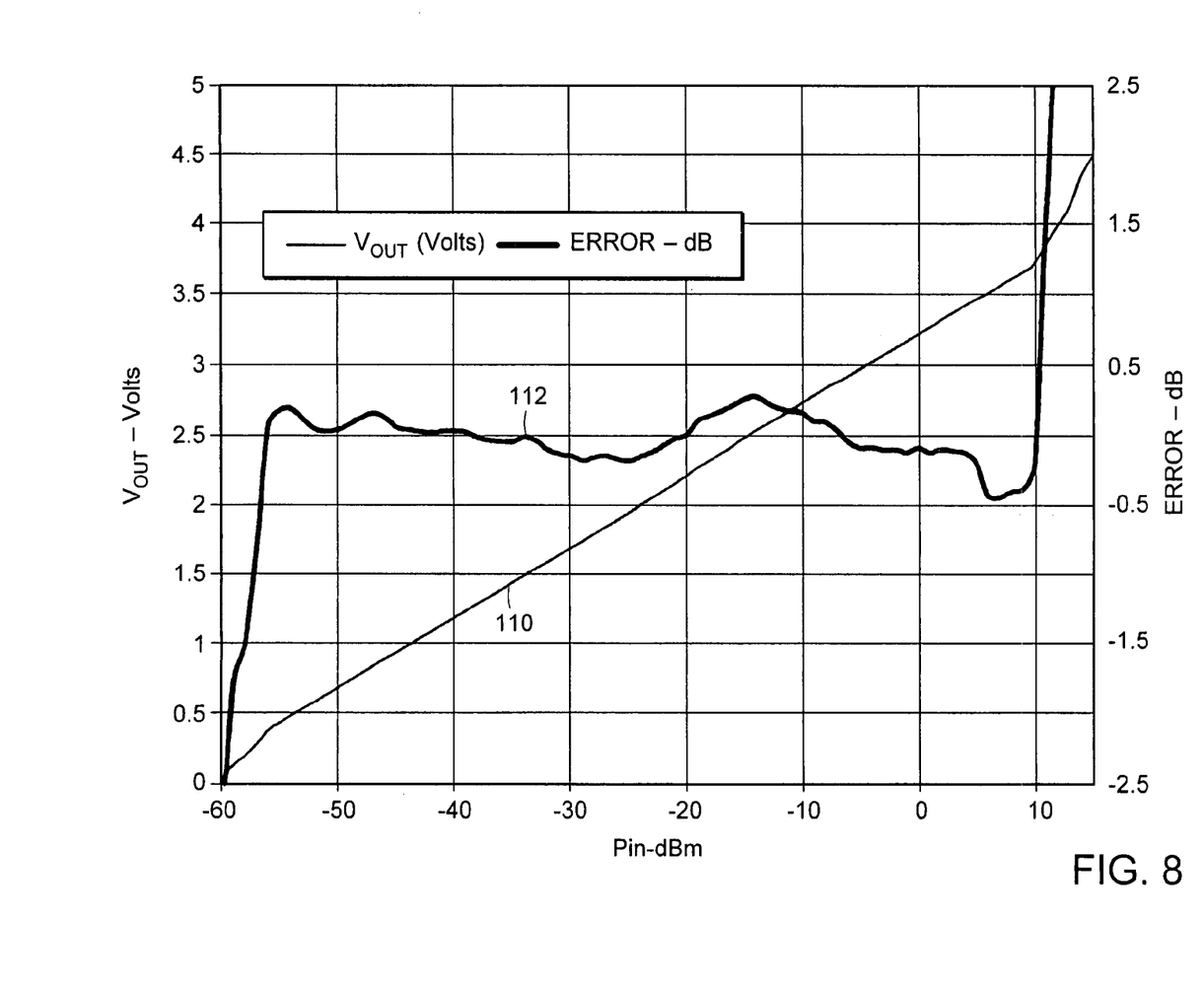
FIG. 8 shows a diagrammatic illustrative graphical view of a transfer function of a system in accordance with a further embodiment of the invention.

FIG. 8 shows the transfer function of this circuit when a sine-wave is applied as an input signal. The voltage is shown at 110 and is scaled on the left-side axis, and the error is shown at 112 and is scaled on the right-side axis. The VTGT voltage which is nominally 1 Vdc now has a 500 mVpp, 10 KHz sine-wave superimposed upon it. Transfer function ripple reduction is being achieved that is similar to the case of the WCDMA signal. The frequency of the dithering signal is not that critical. It should be set high enough so that the output noise can be easily filtered out while still achieving the desired pulse response time.

Those skilled in the art will appreciate that numerous modifications and variations may be made to the above disclosed embodiments without departing from the spirit and scope of the invention.

The invention claimed is:

1. An RMS-to-DC converter system comprising:
   a variable gain amplifier having transfer function ripple that receives an input signal and provides an amplifier output signal;
   a detector that receives the amplifier output signal and provides a detector output signal;
   an error amplifier that receives the detector output signal and provides an error amplifier output signal having an AC component; and
   a feedback circuit coupled to the error amplifier output signal and to the variable gain amplifier for providing a feedback signal to the variable gain amplifier that includes an AC component for reducing transfer function ripple of the RMS-to-DC converter system.

2. The RMS-to-DC converter system as claimed in claim 1, wherein said detector output signal includes an AC component.

3. The RMS-to-DC converter system as claimed in claim 1, wherein said error amplifier includes a reference input node for receiving a reference signal including a DC component and an AC component.

4. The RMS-to-DC converter system as claimed in claim 3, wherein said AC component of said reference signal includes a low frequency sine wave signal.

5. The RMS-to-DC converter system as claimed in claim 3, wherein said AC component of said reference signal includes noise.

6. The RMS-to-DC converter system as claimed in claim 1, wherein the error amplifier output signal is provided to an output node via an RC output circuit.

7. The RMS-to-DC converter system as claimed in claim 1, wherein said error amplifier includes a capacitor that is selected to contribute to permitting the error amplifier output signal to include an AC component.

8. The RMS-to-DC converter system as claimed in claim 1, wherein said detector output signal is a current signal.

9. The RMS-to-DC converter system as claimed in claim 1, wherein said system further includes a reference voltage signal that is applied to a reference RMS circuit for providing at least a squaring and averaging function of said reference voltage signal, said reference voltage signal including an AC component.

10. The RMS-to-DC converter system as claimed in claim 9, wherein said AC component of said reference voltage signal includes a high frequency sinusoidal signal.

11. The RMS-to-DC converter system as claimed in claim 9, wherein said AC component of said reference voltage signal includes white noise.

12. An RMS-to-DC converter system comprising:
a variable gain amplifier having transfer function ripple that receives an input signal and provides an amplifier output signal;
a detector that receives the amplifier output signal and provides a detector output signal;
an error amplifier that receives the detector output signal and a reference signal, and provides an error amplifier output signal having an AC component, said error amplifier including an amplifier feedback circuit between said error amplifier output and an error amplifier input that receives the detector output signal;
a feedback circuit coupled to the error amplifier output signal and to the variable gain amplifier for providing a feedback signal to the variable gain amplifier that includes an AC component for reducing transfer function ripple of the RMS-to-DC converter system.

13. The RMS-to-DC converter system as claimed in claim 12, wherein said amplifier feedback circuit includes a relatively low capacitance capacitor having a capacitance of less than about 500 pF.

14. The RMS-to-DC converter system as claimed in claim 12, wherein said reference signal is a reference voltage signal that is applied to the error amplifier for providing at least a squaring and averaging function of said reference voltage signal.

15. The RMS-to-DC converter system as claimed in claim 14, wherein said reference voltage signal includes an AC high frequency component.

16. The RMS-to-DC converter system as claimed in claim 15, wherein said AC component of said reference voltage signal includes noise.

17. A method providing an RMS-to-DC conversion, said method comprising the steps of:
receiving an input signal and providing an amplifier output signal by a variable gain amplifier having transfer function ripple;
receiving the amplifier output signal and providing a detector output signal;
receiving the detector output signal and providing an error amplifier output signal having an AC component by an error amplifier; and
coupling the error amplifier output signal to the variable gain amplifier for providing a feedback signal to the variable gain amplifier that includes an AC component for reducing transfer function ripple of the RMS-to-DC converter system.

18. The method as claimed in claim 17, wherein said method further includes the step of providing a reference signal to the error amplifier.

19. The method as claimed in claim 18, wherein said reference signal includes an AC component.

* * * * *